(12) United States Patent
Komaki et al.

(10) Patent No.: US 12,098,913 B2
(45) Date of Patent: Sep. 24, 2024

(54) DETECTOR THAT DETECTS RELATIVE POSITIONS OF MARKS WHILE BLOCKING NON-INTERFERENCE LIGHT

(71) Applicant: CANON KABUSHIKI KAISHA, Tokyo (JP)

(72) Inventors: Takamitsu Komaki, Tochigi (JP); Yasuyuki Unno, Tochigi (JP); Tooru Kawashima, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 243 days.

(21) Appl. No.: 17/321,731

(22) Filed: May 17, 2021

(65) Prior Publication Data

US 2021/0372776 A1 Dec. 2, 2021

(30) Foreign Application Priority Data

Jun. 2, 2020 (JP) .................................. 2020-096338

(51) Int. Cl.
  *G01B 11/14* (2006.01)
  *G01B 9/02001* (2022.01)
  *G03F 7/00* (2006.01)

(52) U.S. Cl.
  CPC .......... *G01B 11/14* (2013.01); *G01B 9/02011* (2013.01); *G03F 7/0002* (2013.01); *G03F 7/0005* (2013.01)

(58) Field of Classification Search
  CPC ................ G01B 11/14; G01B 9/02011; G03F 7/0002; G03F 9/7042; G03F 7/0005; G03F 9/7088; G01D 5/38
  See application file for complete search history.

(56) References Cited

U.S. PATENT DOCUMENTS

| 7,292,326 B2 | 11/2007 | Nimmakayala |
| 10,436,576 B2 * | 10/2019 | Minekawa ......... G02B 21/0092 |
| 10,634,995 B2 * | 4/2020 | Minoda ................. H01L 23/544 |
| 2013/0221556 A1 | 8/2013 | Miyaharu et al. |
| 2021/0364279 A1 * | 11/2021 | Manassen ............ G01B 11/272 |

FOREIGN PATENT DOCUMENTS

JP    2013175684 A    9/2013

* cited by examiner

*Primary Examiner* — Hwa Andrew Lee
(74) *Attorney, Agent, or Firm* — ROSSI, KIMMS & McDOWELL LLP

(57) ABSTRACT

A detector that detects relative positions of a first object and a second object in directions different from each other on a predetermined plane, includes an illumination optical system configured to illuminate a first mark provided on the first object and a second mark provided on the second object, and a detection optical system configured to detect interference light of diffracted lights from the first mark and the second mark illuminated by the illumination optical system. A light intensity distribution is formed, on a pupil plane of the illumination optical system, to illuminate the first mark and the second mark from a direction tilted with respect to a normal of the predetermined plane. A pupil plane of the detection optical system allows the interference light to pass through and block at least a part light other than the interference light.

15 Claims, 15 Drawing Sheets

F I G. 13
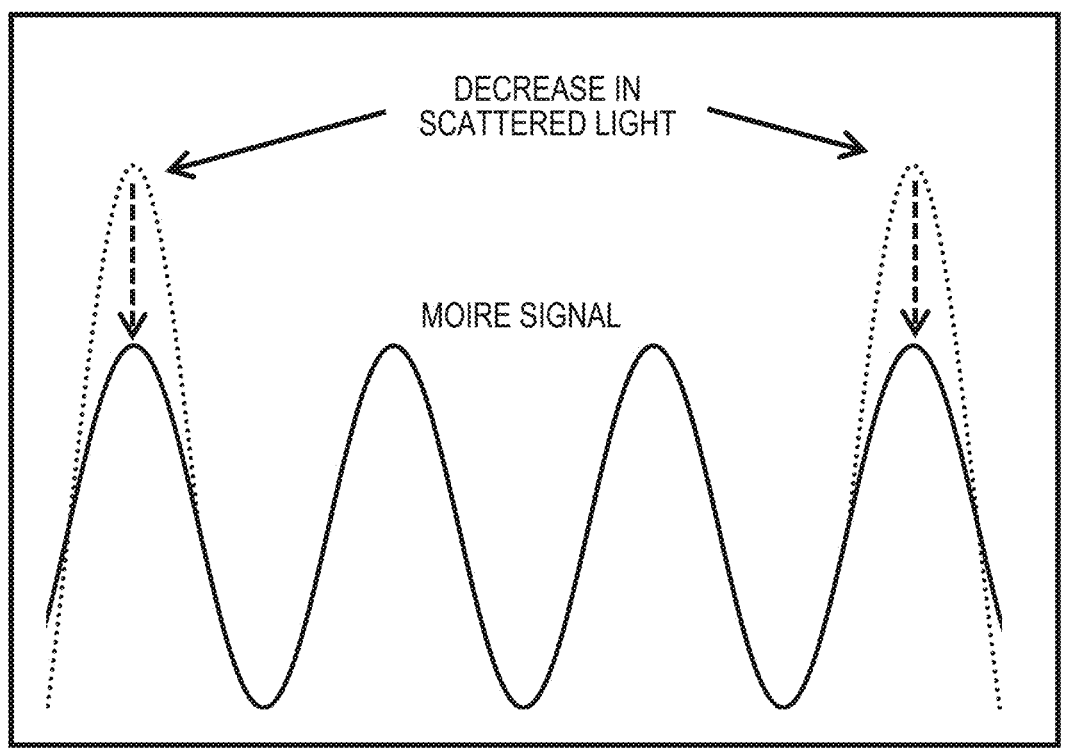

DETECTOR THAT DETECTS RELATIVE POSITIONS OF MARKS WHILE BLOCKING NON-INTERFERENCE LIGHT

BACKGROUND OF THE INVENTION

Field of the Invention

The present invention relates to a detector, an imprint apparatus, and a method of manufacturing an article.

Description of the Related Art

An imprint apparatus brings an imprint material on a shot region of a substrate and a pattern region of a mold into contact with each other and cures the imprint material to form a pattern made of a cured product of the imprint material on the shot region of the substrate. The relative positions of the marks provided on the shot region and the marks provided on the pattern region can be detected to align the shot region and the pattern region.

U.S. Pat. No. 7,292,326 discloses an imprint apparatus that includes a detector for detecting alignment marks. A grating pattern that serves as the alignment mark is arranged on each of a mold and a substrate. The mark on the side of the mold includes a grating pattern that has a grating pitch in a measurement direction. The mark on the side of the substrate includes a checkerboard grating pattern which has a grating pitch in each of the measurement direction and a direction (non-measurement direction) perpendicular to the measurement direction. Each of an illumination optical system that illuminates the marks and a detection optical system that detects diffracted light from the marks is arranged tilted in the non-measurement direction from a direction perpendicular to the mold and the substrate.

In the detection of the relative positions of a mark provided on a first object and a mark provided on a second object, unnecessary light (diffracted light or scattered light) that does not contribute to the detection can be generated. When unnecessary light gets mixed with a detection signal to be detected by a detection apparatus, the detection accuracy of the relative positions can be degraded.

SUMMARY OF THE INVENTION

The present invention provides a technique advantageous in improving the detection accuracy of relative positions.

One of aspects of the present invention provides a detector that detects relative positions of a first object and a second object in directions different from each other on a predetermined plane, comprising: an illumination optical system configured to illuminate a first mark provided on the first object and a second mark provided on the second object; and a detection optical system configured to detect interference light of diffracted lights from the first mark and the second mark illuminated by the illumination optical system, wherein a light intensity distribution is formed, on a pupil plane of the illumination optical system, to illuminate the first mark and the second mark from a direction tilted with respect to a normal of the predetermined plane, and a pupil plane of the detection optical system allows the interference light to pass through and block at least a part of light other than the interference light.

Further features of the present invention will become apparent from the following description of exemplary embodiments with reference to the attached drawings.

BRIEF DESCRIPTION OF THE DRAWINGS

FIG. 13 is a view for explaining a scattered light (unnecessary light) influence reduction effect.

DESCRIPTION OF THE EMBODIMENTS

Figure 1:
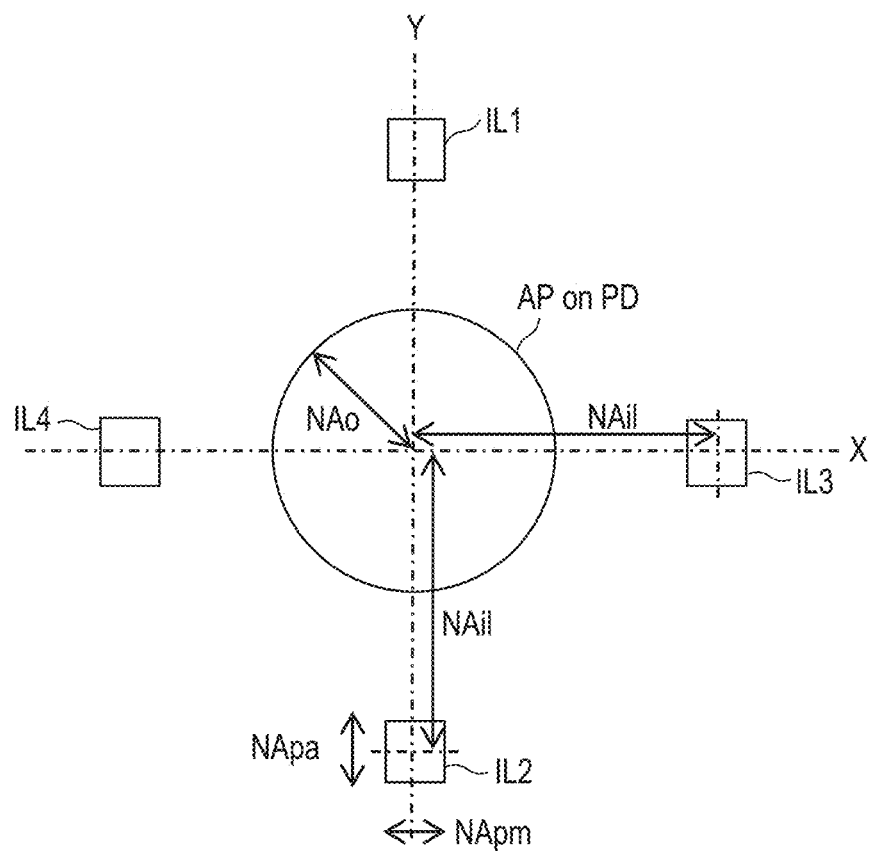
FIG. 1 is a view for explaining an embodiment.

Embodiments of the present invention will be described in detail below with reference to the accompanying drawings. Note that the following embodiments do not limit the invention according to the scope of the appended claims. Although a plurality of features are described in the embodiments, not all the features are essential to the invention and the plurality of features may arbitrarily be combined. The same reference numerals denote the same or similar parts and a repetitive description thereof will be omitted.

Figure 3:
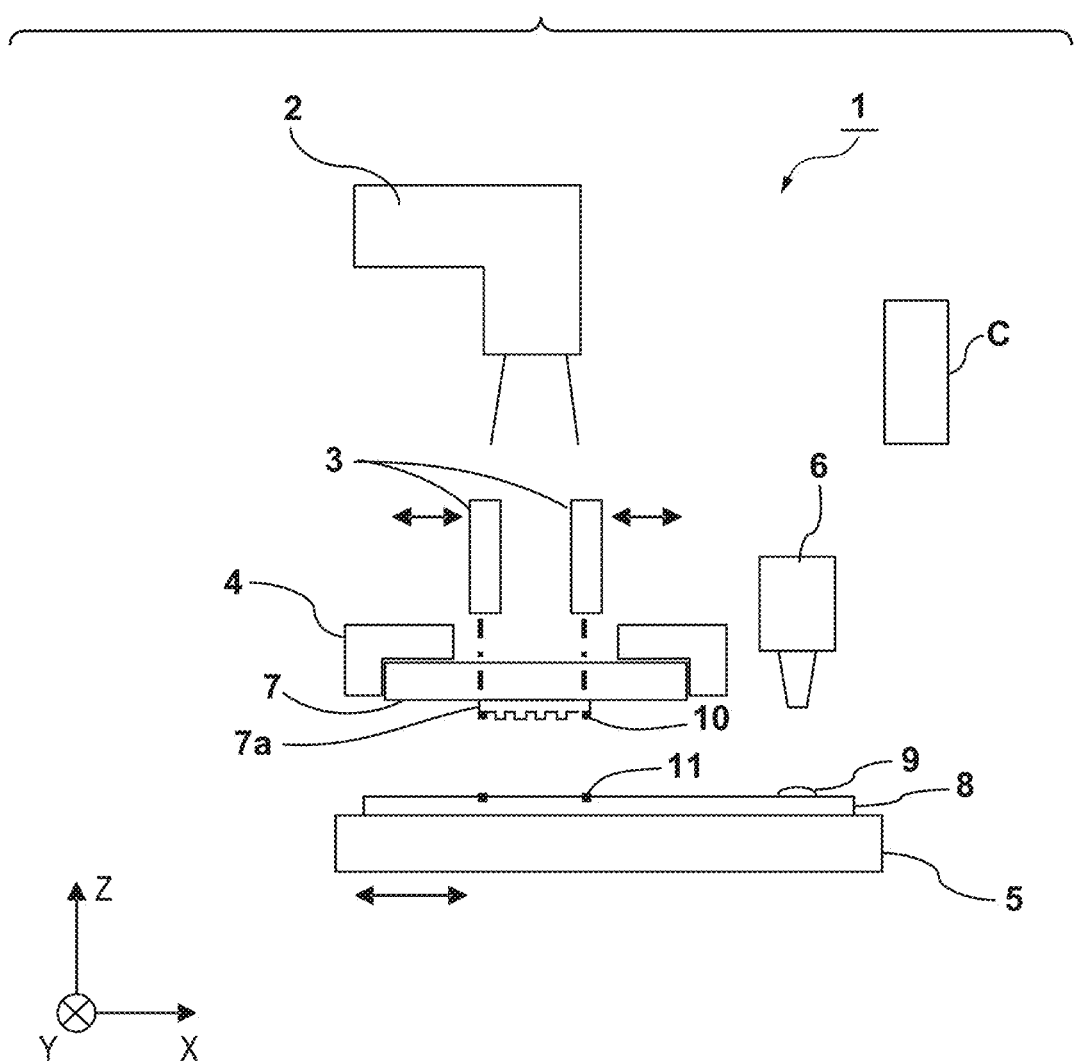
FIG. 3 is a view showing an example of the arrangement of an imprint apparatus according to the embodiment.

FIG. 3 shows an arrangement of an imprint apparatus according to an embodiment. An imprint apparatus 1 can be used in manufacturing an article such as a semiconductor device or the like. The imprint apparatus 1 brings an imprint material 9 on a shot region of a substrate 8 as a processing-target object and a pattern region 7a of a mold 7 into contact with each other and cures the imprint material 9 to form a pattern formed by the cured imprint material 9.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm or more to 1 mm or less. Examples of the electromagnetic wave can be infrared light, a visible light beam, and ultraviolet light. The curable composition can be a composition cured by light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from a group consisting of a sensitizer, a hydrogen donor, an internal mold release agent, a surfactant, an antioxidant, and a polymer component. The imprint material can be arranged on the substrate in the form of droplets or in the form of an island or a film obtained by connecting a plurality of droplets. The imprint material can be supplied as a film on the substrate by a spin coater or a slit coater. The viscosity (the viscosity at 25° C.) of the imprint material is, for example, 1 mPa·s or higher to 100 mPa·s or lower. Examples of the substrate material can be glass, a ceramic, a metal, a semiconductor (Si, GaN, SiC, or the like), a resin, and the like. A member made of a material different from the substrate may be formed on the surface of the substrate as needed. Examples of the substrate are a silicon wafer, a compound semiconductor wafer, and silica glass.

In the specification and the accompanying drawings, directions will be indicated by an XYZ coordinate system in which directions parallel to the surface of the substrate 8 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are $\theta X$, $\theta Y$, and $\theta Z$, respectively. The X direction and the Y direction can also be expressed as the first direction and the second direction, respectively. The X direction and the Y direction are directions that intersect with or are perpendicular to each other.

The imprint apparatus 1 includes, for example, a curing unit 2, a detector 3, a mold driving mechanism 4, a substrate driving mechanism 5, a dispenser (supplying unit) 6, and a control unit C. The curing unit 2 irradiates the imprint material 9 with curing energy after the imprint material 9 on a shot region of the substrate 8 and the pattern region 7a of the mold 7 have been brought into contact with each other and the space between the shot region and the pattern region 7a have been filled with the imprint material 9. As a result, the imprint material 9 is cured, and a pattern made of the cured imprint material 9 is formed.

The curing energy can be, for example, ultraviolet light. In such a case, the curing unit 2 can include a light source that generates the ultraviolet light and a plurality of optical elements for irradiating the imprint material 9, via the pattern region 7a of the mold 7, with the ultraviolet light emitted from the light source. The irradiation region of the curing energy can be set to have an area similar to the area of the pattern region 7a or an area slightly larger than the area of the pattern region 7a. By limiting the area of the curing energy irradiation region to a minimum necessary area, it will be possible to suppress the mold 7 or the substrate 8 from expanding due to the heat generated by the irradiation and prevent the pattern to be transferred to the imprint material 9 from positionally shifting or warping. In addition, if the curing energy is reflected by the substrate 8 or the like and enters the dispenser 6, the imprint material 9 that remains in the discharge outlet of the dispenser 6 can become cured. It is also preferable, from such a point of view, to limit the area of the curing energy irradiation region to a minimum necessary area. For example, a high-pressure mercury lamp, various kinds of excimer lamps, an excimer laser, or a light-emitting diode can be employed as the light source. The type of the light source, the number of light sources, and the wavelength of light to be generated from the light source can be appropriately selected in accordance with the properties of the imprint material 9.

The mold 7 can include the pattern region 7a which has a pattern to be transferred to the imprint material 9 or the substrate 8. The pattern can be formed of a plurality of concave portions that include the respective shapes of a plurality of features (for example, a line pattern, a contact pattern, and the like) to be transferred. The mold 7 can be made of quartz or the like which is capable of transmitting the curing energy, for example, ultraviolet light. The mold driving mechanism 4 can include a mold chuck that holds the mold 7 by a vacuum suction force, an electrostatic attraction force, or the like and a mold driving actuator that drives the mold 7 by driving the mold chuck. The mold driving mechanism 4 can be configured to drive the mold 7 with respect to a plurality of axes (for example, three axes including the Z-axis, $\theta X$-axis, and $\theta Y$-axis, and preferably six axes including the X-axis, Y-axis, Z-axis, $\theta X$-axis, $\theta Y$-axis, and $\theta Z$-axis). The mold driving mechanism 4 can further include a shape correcting mechanism that corrects the shape of the pattern region 7a of the mold 7 by deforming the mold 7.

The substrate driving mechanism 5 can include a substrate chuck that holds the substrate 8 by a vacuum suction force, an electrostatic attraction force, or the like and a substrate driving actuator that drives the substrate 8 by driving the substrate chuck. The substrate driving mechanism 5 can be configured to drive the substrate 8 with respect to a plurality of axes (for example, three axes including the X-axis, Y-axis, and $\theta Z$-axis, and preferably six axes including the X-axis, Y-axis, Z-axis, $\theta X$-axis, $\theta Y$-axis, and $\theta Z$-axis).

The mold driving mechanism 4 and the substrate driving mechanism 5 can form an adjustment mechanism that adjusts the relative positions of the mold 7 (of the pattern region 7a) and the substrate 8 (or the shot region). The mold driving mechanism 4 and/or the substrate driving mechanism 5 can perform a contacting operation to bring the imprint material 9 on the shot region of the substrate 8 into contact with the pattern region 7a of the mold 7 and a separating operation to separate the cured imprint material 9 from the pattern region 7a. The mold 7 and the substrate 8 are arranged spaced apart from each other in the Z direction in the XYZ coordinate system, and are examples of a first object and a second object, respectively, which are to undergo relative positional adjustment (alignment). The detector 3 described in this embodiment is applicable to not only the imprint apparatus 1, but also, for example, another apparatus such as an exposure apparatus that transfers the pattern of an original to a resist on a substrate or the like.

The detector 3 is configured to detect the relative positions of each mark 10 provided on the mold 7 (or the pattern region 7a of the mold 7) and each mark 11 provided on the substrate 8 (or the shot region of the substrate 8). The plurality of marks 10 are provided on the pattern region 7a of the mold 7, and the plurality of marks 11 are also provided on the shot region of the substrate 8 in a similar manner. One mark 10 and one mark 11 can form a pair of marks. The detector 3 can detect the relative positions of a plurality of pairs of marks to detect the relative positions (alignment error) of the shot region and the pattern region 7a with respect to the X-axis, the Y-axis, and the $\theta Z$-axis. The detector 3 can also detect the relative positions of the plurality of pairs of marks to detect the shape difference (another form of an alignment error) between the shot region and the pattern region 7a.

The optical axis of the detector 3 can be arranged to be perpendicular with respect to the surface of the substrate 8. The detector 3 is configured to be able to move in the X direction and the Y direction in accordance with the positions of the marks 10 and 11 arranged on the mold 7 and the substrate 8, respectively. The detector 3 can also be configured to be able to move in the Z direction to perform a focus operation in accordance with a Z-directional position (height) of the marks 10 and 11. Alternatively, the detector 3 may include a focus optical system. The control unit C can control the substrate driving mechanism 5 and the mold driving mechanism 4 to align the shot region and the pattern region 7a based on the result detected by using the detector 3.

The dispenser 6 can arrange or supply the uncured-state imprint material 9 on the substrate 8. The dispenser 6 can be installed outside the imprint apparatus 1. In such a case, the substrate 8 to which the imprint material 9 has been arranged by dispenser 6 outside the imprint apparatus 1 will be provided to the imprint apparatus 1. The control unit C can control the curing unit 2, the detector 3, the mold driving mechanism 4, the substrate driving mechanism 5, and the dispenser 6. In another point of view, the control unit C can control the following imprint process. The control unit C can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general purpose or dedicated computer embedded with a program, or a combination of all or some of these components.

The imprint process will be described here. First, the control unit C causes a substrate conveyance mechanism (not shown) to convey the substrate 8 to a substrate chuck of the substrate driving mechanism 5 and causes the substrate chuck to hold the substrate 8. Next, the control unit C controls the substrate driving mechanism 5 and the dispenser 6 so that the imprint material 9 will be arranged on a shot region of the substrate 8 by the dispenser 6. Next, the control unit C controls the substrate driving mechanism 5 so that the shot region of the substrate 8 will be positioned immediately below the mold 7. Next, the control unit C controls the substrate driving mechanism 5 and/or the mold driving mechanism 4 to bring the imprint material 9 on the shot region of the substrate 8 into contact with the pattern region 7a of the mold 7. In this state, the control unit C will use the detector 3 to detect an alignment error between the shot region of the substrate 8 and the pattern region 7a of the mold 7, and control the substrate driving mechanism 5 and/or the mold driving mechanism 4 to reduce the alignment error. The control unit C waits for the imprint material 9 to fill the space between the shot region and the pattern region 7a, and controls the curing unit 2 to irradiate the imprint material 9 with the curing energy. As a result, the imprint material 9 is cured, and a pattern made of the cured imprint material 9 is formed. Next, the control unit controls the substrate driving mechanism 5 and/or the mold driving mechanism 4 to separate the cured imprint material from the pattern region 7a of the mold 7. As a result, the imprint process for one shot region is completed. The control unit C repeats the above-described process so that the imprint process will be performed on each of the plurality of shot regions on the substrate 8. Subsequently, the control unit C causes the substrate conveyance system (not shown) to collect the substrate 8 from the substrate chuck of the substrate driving mechanism 5.

Figure 4:
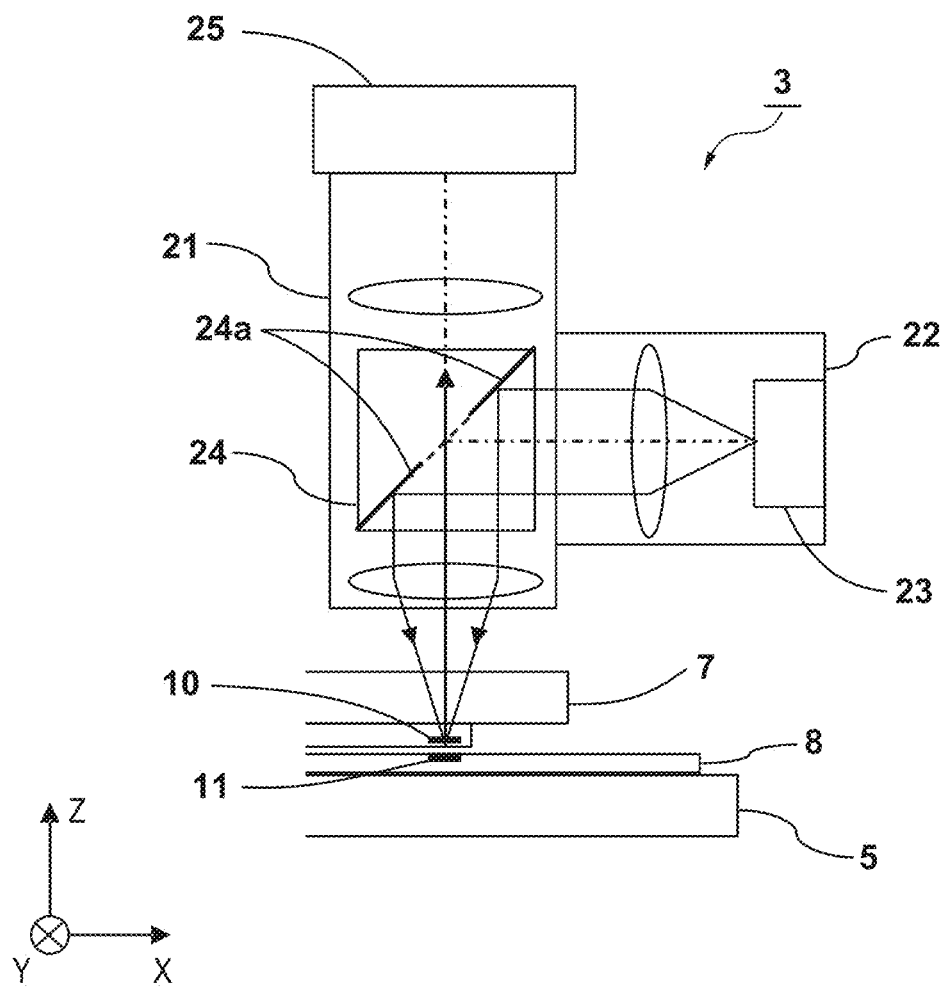
FIG. 4 is a view showing an example of the arrangement of a detector according to the embodiment.

The detector 3 will be described hereinafter. FIG. 4 shows an example of the arrangement of the detector 3. The detector 3 can include a detection optical system 21 and an illumination optical system 22. The illumination optical system 22 can guide light from a light source 23 via a prism 24 or the like to the same optical axis as the detection optical system 21 and obliquely illuminate the marks 10 and 11. In other words, the illumination optical system 22 can illuminate the marks 10 and 11 with a beam of light that is tilted with respect to the optical axis (the normal (Z-axis) of the X-Y plane). The light source 23 can be formed by, for example, a halogen lamp, an LED, or the like. The light source 23 can emit light, for example, visible light or infrared light, which does not include light of a wavelength that can cure the imprint material 9. The detection optical system 21 and the illumination optical system 22 can be formed to share some of the optical members that form these systems. The prism 24 can be arranged on the pupil plane or near the pupil plane of one of the detection optical system 21 and the illumination optical system 22. Each of the marks 10 and 11 can be formed as a grating pattern. The detection optical system 21 can form, on an imaging plane of an image sensor 25, an image of interference light (interference fringes or moiré fringes) which is generated by the interference between the diffracted light beams diffracted by the marks 10 and 11 illuminated by the illumination optical system 22. The image sensor 25 can be, for example, a CCD or a CMOS sensor.

The prism 24 can include a bonding surface and include, on this bonding surface, a reflecting film 24a for reflecting the light from a peripheral portion of the pupil plane of the illumination optical system 22. The reflecting film 24a can also function as an aperture stop that is provided with an aperture which defines the size (or a detection numerical aperture NAo) of the pupil of the detection optical system 21. The reflecting film 24a can also function as a stop for forming a light intensity distribution (effective light source distribution) formed on the pupil plane of the illumination optical system 22. The prism 24 may be formed by a half prism which includes a semitransparent film on the bonding surface. The prism 24 may also be substituted by a plate-like optical element which includes a reflecting film on its surface. The position where the prism 24 is to be arranged does not need to be the pupil plane or the vicinity of the pupil plane of one of the detection optical system 21 and the illumination optical system 22.

Figure 5:
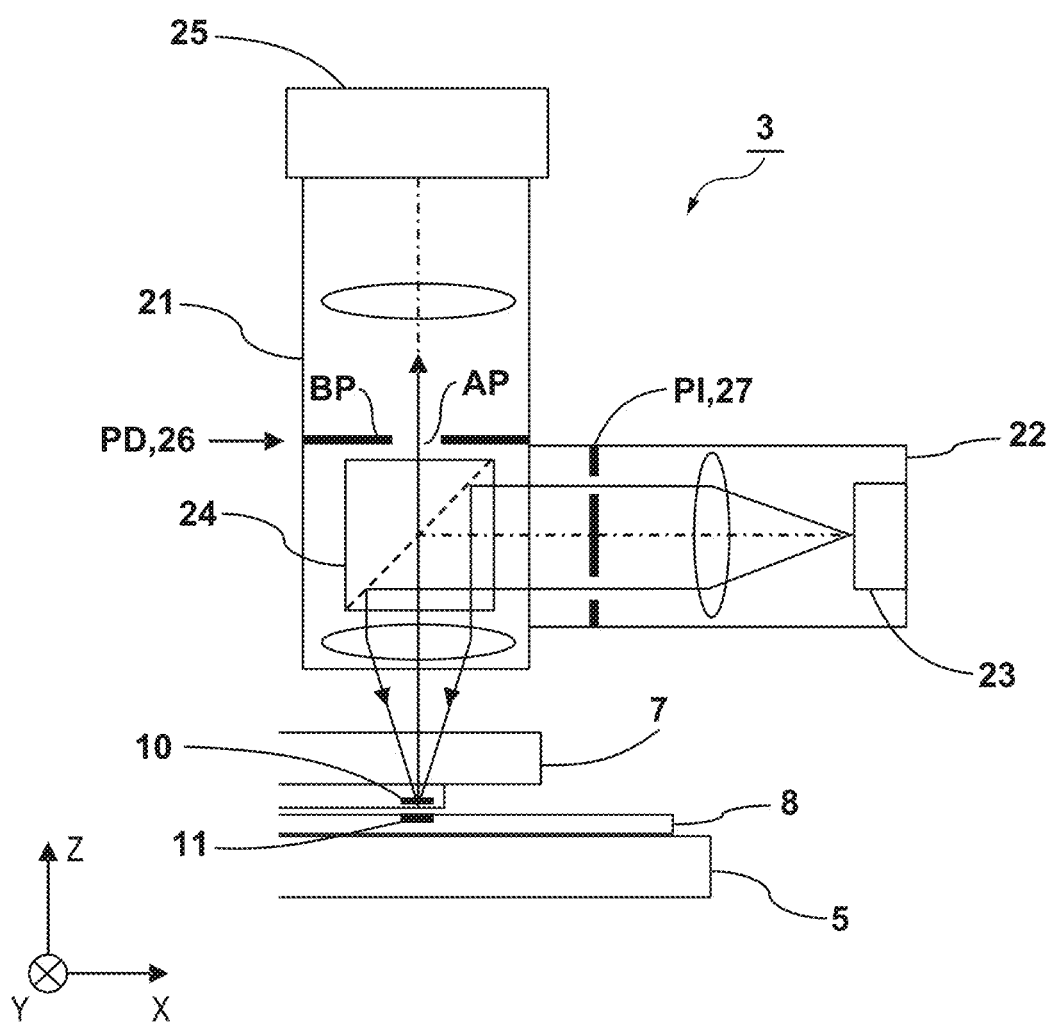
FIG. 5 is a view showing an example of another arrangement of the detector according to the embodiment.

FIG. 5 shows an example of another arrangement of the detector 3. In the example of the arrangement shown in FIG. 5, a pupil plane PI of the illumination optical system 22 and a pupil plane PD of the detection optical system 21 are arranged spaced apart from each other. An illumination aperture stop 27 is arranged on the pupil plane PI of the illumination optical system 22, and a detection aperture stop 26 is arranged on the pupil plane PD of the detection optical system 21. The illumination aperture stop 27 defines the light intensity distribution on the pupil plane PI, and can define, for example, a light intensity distribution including four poles IL1, IL2, IL3, and IL4 as shown in FIG. 1. The prism 24 can be, for example, a half-prism that includes a semitransparent film on the bonding surface.

FIG. 1 shows an example of the relationship between the pupil plane PD of the detection optical system 21 and the light intensity distribution (effective light source distribution) including the poles IL1 to IL4 formed on the pupil plane PI of the illumination optical system 22. In FIG. 1, the relationship between the poles IL1 to IL4 of the illumination optical system 22 and an aperture AP of the detection aperture stop 26 arranged on the pupil plane PD of the detection optical system 21 is represented by a numerical aperture (NA). The light intensity distribution on the pupil plane PI of the illumination optical system 22 includes the first pole IL1, the second pole IL2, the third pole IL3, and the fourth pole IL4. Each of the four poles IL1 to IL4 has a rectangular shape defined by $NApm \times NApa$. The center of the first pole IL1 and the center of the second pole IL2 are arranged at positions apart from coordinates (0, 0) by $NAil$ in the +Y direction and the −Y direction, respectively. The third pole IL3 and the fourth pole IL4 are arranged at positions apart from the coordinates (0, 0) by NAil in the +X direction and the −X direction, respectively. That is, the illumination optical system 22 is formed so as to obliquely illuminate the marks 10 and 11. The first pole IL1 and the second pole IL2 form, on the pupil plane PI, light intensity distributions that illuminate the marks 10 and 11 from directions tilted with respect to the normal and parallel to a Y-Z plane defined by the Y direction and the normal (Z-axis) of the X-Y plane. The third pole IL3 and the fourth pole IL4 form, on the pupil plane PI, light intensity distributions that illuminate the marks 10 and 11 from directions tilted with respect to the normal and parallel to an X-Z plane defined by the X direction and the normal (Z-axis) of the X-Y plane.

An angle θ of incidence at which the light enters the marks 10 and 11 can be represented by $$\theta = \sin^{-1}(\text{NAil}) \tag{1}$$

The aperture AP of the detection aperture stop 26 arranged on the pupil plane PD of the detection optical system 21 is a 2 (diameter)×NAo circle about the coordinates (0, 0). The illumination optical system 22 and the detection optical system 21 can be arranged so that NAo, NApa, and NAil satisfy $$\text{NAo} < \text{NAil} - \text{NApa}/2 \tag{2}$$

That is, the detector 3 can have a dark-field configuration that does not detect specularly reflected light (zeroth-order diffracted light) from the marks 10 and 11.

Figure 7A:
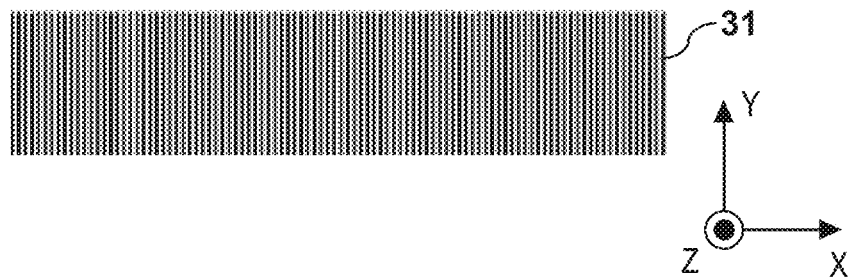
FIGS. 7A to 7D are views for explaining the principle for detecting relative positions.
Figure 7B:
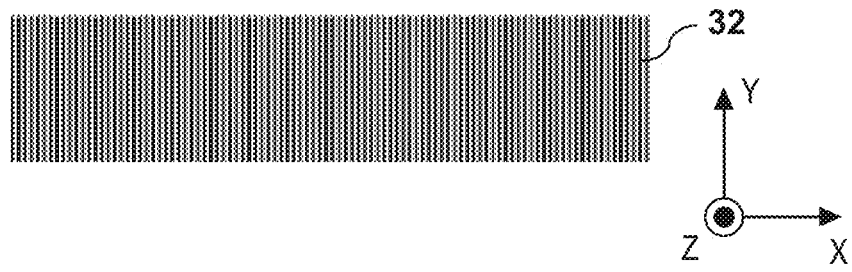
Figure 7C:
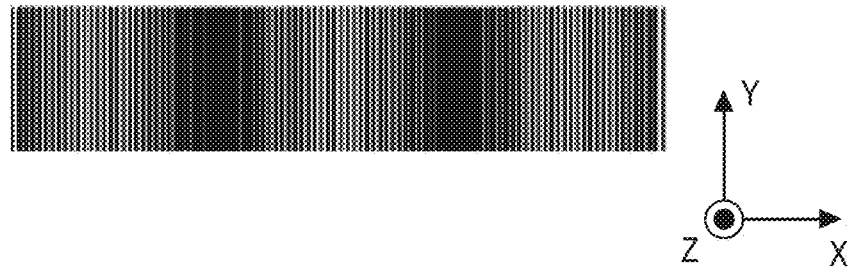
Figure 7D:
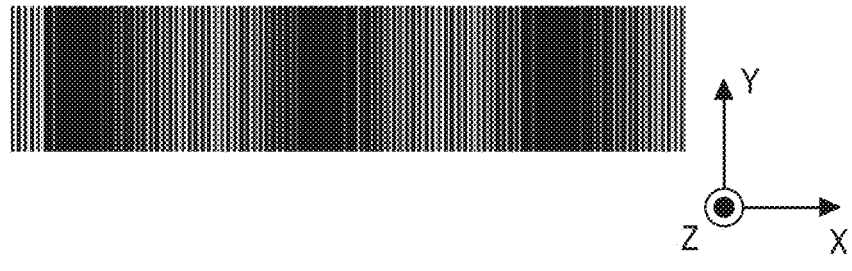

The principle of the generation of moiré fringes and a method of detecting the relative positions (alignment error) of the pattern region 7a of the mold 7 and the shot region of the substrate 8 by using the moiré fringes will be explained. When grating patterns 31 and 32 which have slightly different grating pitches as shown in FIGS. 7A and 7B are overlaid on each other, diffracted light beams from the two grating patterns 31 and 32 interfere with each other. Consequently, interference fringes (moiré fringes) which have a period reflecting the difference between the grating pitches are generated as shown in FIG. 7C. The moiré fringes change the positions of brightness and darkness (the phases of the fringes) in accordance with the relative positions of the grating patterns 31 and 32. For example, when one of the grating patterns 31 and 32 is shifted in the X direction, the moiré fringes shown in FIG. 7C change to moiré fringes shown in FIG. 7D. Since the moiré fringes are generated as large-period fringes by enlarging the actual relative-positional shift amount between the grating patterns 31 and 32, the relative positions of the two objects can be measured highly accurately even when the resolving power of the detection optical system 21 is low.

Figure 8A:
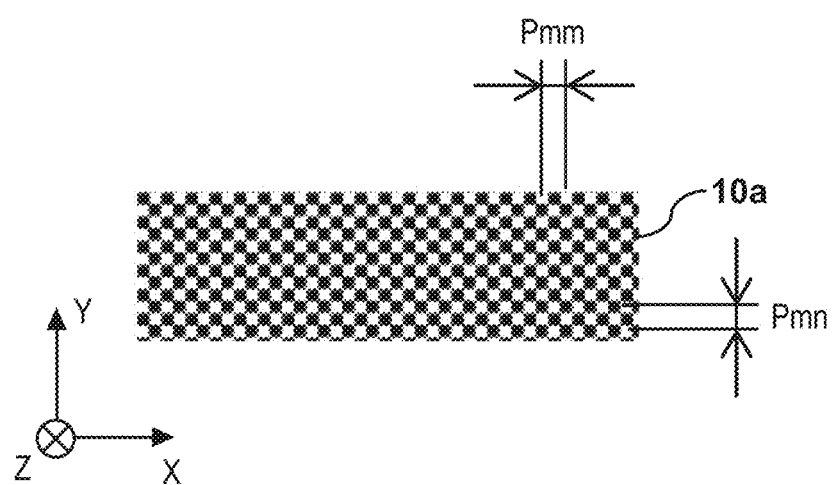
FIGS. 8A and 8B are views showing an example of marks that form a pair of marks.
Figure 8B:
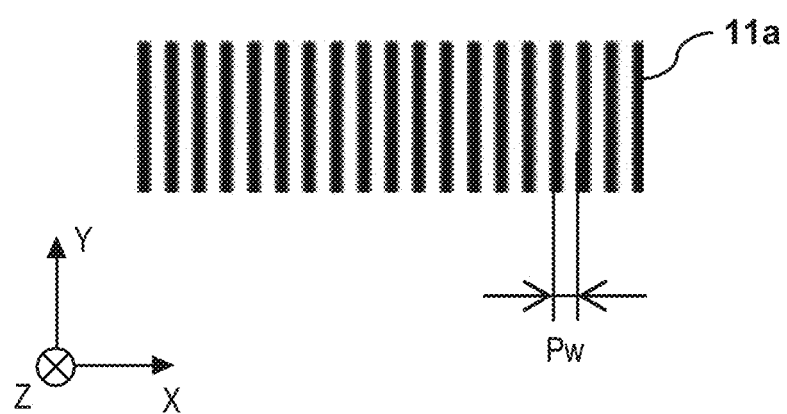

When the grating patterns 31 and 32 are detected in a bright field (the grating patterns 31 and 32 are illuminated from a vertical direction, and diffracted light beams are detected from the vertical direction) in order to detect the moiré fringes (interference light), the detector 3 will detect the zeroth-order diffracted light from the grating pattern 31 and/or the zeroth-order diffracted light from the grating pattern 32. The zeroth-order diffracted light from one of the grating patterns 31 and 32 can reduce the contrast of the moiré fringes. Hence, as described above, the detector 3 according to the embodiment can have a dark-field configuration that will not detect the zeroth-order diffracted light. To allow the moiré fringes to be detected even in a dark-field configuration in which oblique illumination is performed, one of the mark 10 of the mold 7 and the mark 11 of the substrate 8 can be formed into a checkered grating pattern as shown in FIG. 8A, and the other can be formed into a grating pattern as shown in FIGS. 7A and 7B. There is basically no difference regardless of whether the mark 10 arranged on the mold 7 or the mark 11 arranged on the substrate 8 is formed into a checkered grating pattern. However, an example in which the mark 10 of the mold 7 is formed by the checkered grating pattern will be described hereinafter.

Figure 9A:
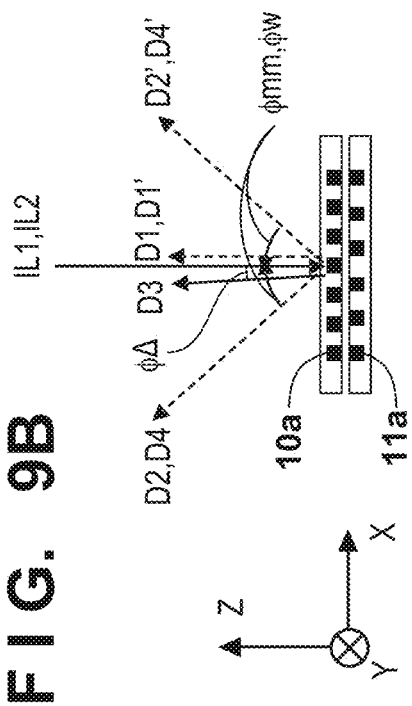
FIGS. 9A to 9D are views showing diffracted light from the pair of marks.
Figure 9C:
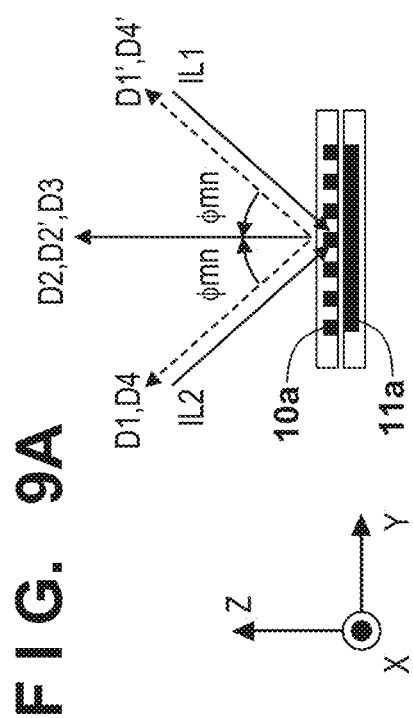
Figure 9B:
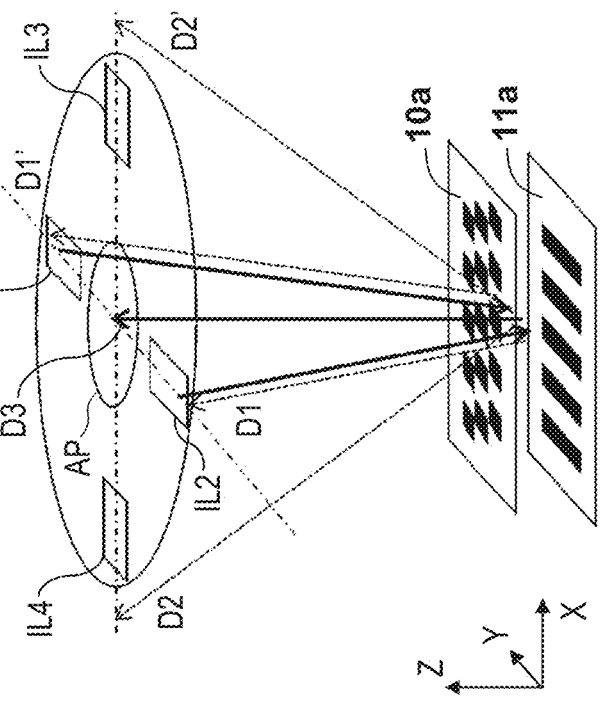

FIGS. 9A and 9B each show the mark (first mark) 10 of the mold 7 and the mark (second mark) 11 of the substrate 8 for detecting the relative positions in the X direction (first direction) of the mold (first object) 7 and the substrate (second object) 8. The mark 10 of the mold 7 has a checkered grating pattern 10a which has grating pitches Pmm and Pmn in the X direction and the Y direction, respectively. The mark 11 of the substrate 8 has a checkered grating pattern 11a which has a grating pitch Pw different from Pmm in only the X direction. The principle by which the detector 3 detects the moiré fringes in a state in which the two grating patterns 10a and 11a are overlaid on each other will be described with reference to FIGS. 9A to 9D.

FIGS. 9A and 9B are a view in which the grating pattern 10a and the grating pattern 11a are viewed in the X direction and a view in which the grating pattern 10a and the grating pattern 11a are viewed in the Y direction, respectively. The moiré fringes for detecting the relative position in the X direction are generated by light beams from the first pole IL1 and the second pole IL2 aligned in the Y-axis direction on the pupil plane PI of the illumination optical system 22. An angle φ of diffraction by the grating patterns 10a and 11a is represented by
where d is a grating pitch, λ is a wavelength of light emitted by the illumination optical system 22, and n is the order of diffraction.

Hence, letting φmm and φmn be the angle of diffraction in the X direction and the angle of diffraction in the Y direction, respectively, by the grating pattern 10a, and letting φw be an angle of diffraction by the grating pattern 11a, the following equations are established.

$$\sin \varphi mm = n\lambda/\text{Pmm} \tag{4}$$

$$\sin \varphi mn = n\lambda/\text{Pmn} \tag{5}$$

$$\sin \varphi w = n\lambda/\text{Pw} \tag{6}$$

First, the diffracted light in the Y direction (second direction) as the non-measurement direction will be described with reference to FIG. 9A. The grating pattern 10a and the grating pattern 11a are illuminated by beams of light from the first pole IL1 and the second pole IL2 arrayed in the Y direction as the non-measurement direction on the pupil plane PI of the illumination optical system 22. Since the detector 3 satisfies equation (2), the light beams (zeroth-order diffracted light beams) D1 and D1' specularly reflected by the grating patterns 10a and 11a will not pass through the aperture AP of the detection aperture stop 26 arranged on the pupil plane PD of the detection optical system 21.

Reference symbols D2 and D2' indicate diffracted light beams which are diffracted at the ±1st order by only the grating pattern 10a of the mold 7, and reference symbol D3 indicates diffracted light beam which is diffracted at the +/−1st order by the grating pattern 10a of the mold 7 and diffracted at the −/+1st order by the grating pattern 11a of the substrate 8. Reference symbol D3 is diffracted light to be used for detecting the relative positions of (the pattern region 7a of) the mold 7 and (the shot region of) the substrate 8 by the detector 3. The diffracted light beam D3 that is diffracted at only the angle φmn by the grating pattern 10a of the mold 7, which has the grating pitch Pmn in the Y direction, passes through the aperture AP of the detection aperture stop 26 arranged on the pupil plane PD of the detection optical system 21, and is detected by the image sensor 25.

In this embodiment, among the diffracted light beams except for the zeroth-order diffracted light, diffracted light which has a high diffraction intensity, that is, the diffracted light D3 which is diffracted at the +/−1st order by the grating pattern 10a and diffracted at the −/+1st order by the grating pattern 11a is detected. Hence, the detector 3 is formed so that Pmn, NAo, NAil, and NApa satisfy equation (7) below. In other words, the detector 3 can detect diffracted light in the Y direction at the wavelength λ within a range that satisfies:

$$|NAil-|\sin \varphi mn||=|NAil-\lambda/Pmn|<NAo+NApa/2 \quad (7)$$

The diffracted light D3 can be detected most efficiently when the diffracted light D3 is perpendicular to the Y direction. Letting λc be the central wavelength of the light from the light source, the illumination conditions of the illumination optical system 22 and the grating pitch Pmn of the grating pattern 10a on the side of the mold can be adjusted to satisfy Hence, as described above, in the Y direction (non-measurement direction), the grating pattern 10a of the mold 7 is obliquely illuminated, and the diffracted light diffracted in the non-measurement direction by the grating pattern 10a is detected by the image sensor 25.

Next, the diffracted light in the X direction (first direction) as the measurement direction will be described with reference to FIG. 9B. The light beams from first pole IL1 and the second pole IL2 arranged on the Y-axis on the pupil plane PI of the illumination optical system 22 enter the grating patterns 10a and 11a in a direction perpendicular to the X-axis. If the +/−1st-order diffracted light is considered in a manner similar to diffracted light in the Y direction, the diffracted light D3 diffracted at the +/−1st order by the grating pattern 10a of the mold 7 and diffracted at the −/+1st order by the grating pattern 11a of the substrate 8 will enter the detection optical system 21 at a small angle because Pmn and Pw are close to each other.

FIG. 9C shows the way in which the diffracted light D3 is diffracted. Solid arrows indicate diffracted light beams diffracted at the +/−1st order by the grating pattern 10a of the mold 7, diffracted at the −/+1st order by the grating pattern 11a of the substrate 8, and transmitted through the mold 7. Also, dotted arrows indicate diffracted light beams transmitted through the grating pattern 10a of the mold 7, diffracted at the −/+1st order by the grating pattern 11a on the side of the substrate, and diffracted at the +/−1st order by the grating pattern 10a of the mold 7. In this case, a diffraction angle φΔ is represented by:

$$\sin \varphi\Delta=\lambda\times|Pw-Pmm|/(PmmPw) \quad (9)$$

When $|Pw-Pmm|/(PmmPw)=1/P\Delta$ in equation (9), sin φΔ is represented by:

$$\sin \varphi\Delta=\lambda/P\Delta \quad (10)$$

Equation (10) represents that the diffracted light D3 causes interference fringes which have a period $P_\Delta$ to appear. The interference fringes are moiré fringes, and their period depends on the difference between the grating pitch of the grating pattern 10a of the mold 7 and the grating pitch of the grating pattern 11a of the substrate 8. However, since the grating pattern 10a of the mold 7 is a checkered grating pattern in this embodiment, the period of the generated moiré fringes is PΔ/2. In this case, since the relative positions between the pattern region 7a of the mold 7 and the shot region of the substrate 8 will appear enlarged at the bright and dark portions of the moiré fringes, the relative positions can be detected highly accurately even when the resolving power of the detection optical system 21 is low.

The diffracted light beams D2 and D2' diffracted at the 1st order by only the grating pattern 10a of the mold 7 or diffracted light beams D4 and D4' diffracted at the 1st order by only the grating pattern 11a of the substrate 8 exit at the angle φmm or the angle φw (FIG. 9B). Since the diffracted light beams D2, D2', D4, and D4' do not generate moiré fringes but become unnecessary light beams (noise), it is preferable to prevent them from being detected by the detection optical system 21. Accordingly, the grating pitch Pmm of the grating pattern 10a, the grating pitch Pw of the grating pattern 11a, and the numerical aperture NAo of the detection aperture AP of the detector 3 are set so as to satisfy:

$$NAo+NApm/2<|\sin \varphi mm|=\lambda/Pmm \quad (11)$$

$$NAo+NApm/2<|\sin \varphi w|=\lambda/Pw \quad (12)$$

Figure 9D:
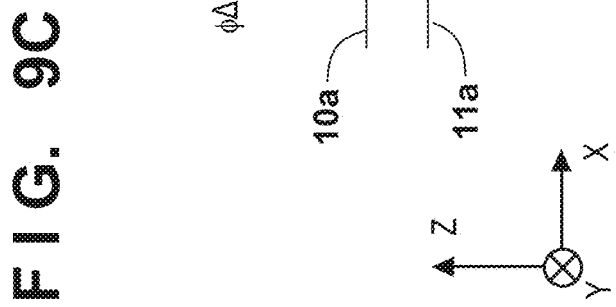

Light beams not diffracted in the X direction by either of the grating pattern 10a of the mold 7 and the grating pattern 11a of the substrate 8 (the zeroth-order diffracted light beams, that is, the light beams D1 and D1' shown in FIG. 9B) exit at an angle to be detected by the detection optical system 21 with respect to the X-axis. Diffracted light beams D5 and D5' not diffracted by the grating pattern 11a of the substrate 8 but diffracted at the +/−nth order and −/+nth order (zeroth order in total) in the X direction by the grating pattern 10a on the side of the mold before and after being reflected by the substrate 8 also exit at an angle to be detected by the detection optical system 21 with respect to the X-axis. The diffracted light beams D5 and D5' do not generate moiré fringes but decrease the contrast of moiré fringes. However, since the grating pattern 10a of the mold 7 is a checkered grating pattern in this embodiment, the phases of the diffracted light beams D5 and D5' from adjacent gratings shift from each other by π and cancel each other. Hence, the intensity of the diffracted light beams D5 and D5' is suppressed, and high-contrast moiré fringes can be detected. FIG. 9D is a view that represents FIGS. 9A and 9B in a three-dimensional manner. The diffracted light beams D5 and D5' are not illustrated in FIG. 9D because the intensity of these light beams will be suppressed.

As described above, the pupil plane PD or the detection aperture stop 26 of the detection optical system 21 is formed to transmit, while blocking at least a part of the light other than the interference light, the interference light generated by the predetermined diffracted light (first-order diffracted light) from each of the marks 10 and 11.

Figure 10A:
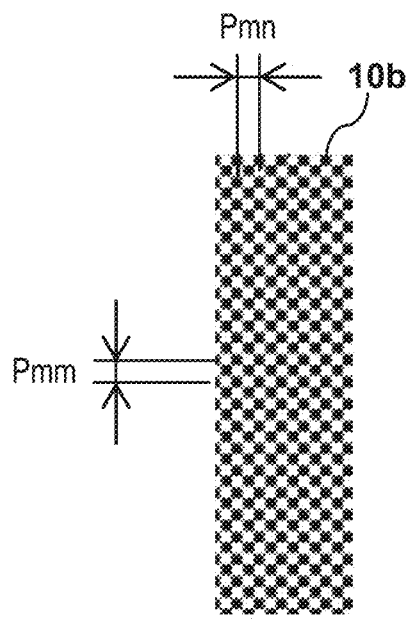
FIGS. 10A and 10B are views showing an example of the marks that form the pair of marks.
Figure 10B:
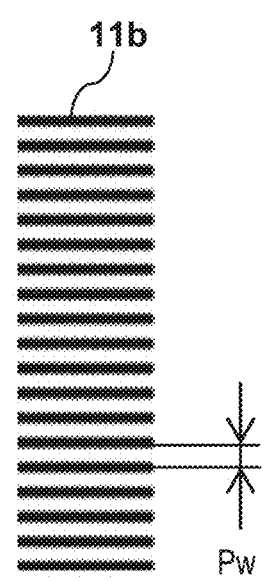
Figure 10B:
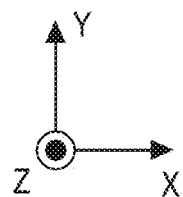
Figure 10B:
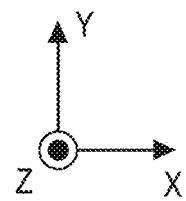

The detection of moiré fringes for detecting the relative positions of the mold 7 and the substrate 8 in the X direction has been described above. Except for the fact that the marks and the illumination directions are switched between the X direction and the Y direction, the detection of the moiré fringes for detecting the relative positions of the mold 7 and substrate 8 in the Y direction is basically the same as that performed in the X direction. That is, as shown in FIG. 10A, a checkered grating pattern 10b, having the grating pitch Pmn in the X direction and the grating pitch Pmn in the Y direction can be provided, on the mold 7, as a mark for detecting the relative position in the Y direction. Also, as shown in FIG. 10B, a grating pattern 11b having the grating pitch $P_w$ different from the grating pitch Pmm in only the Y direction can be provided, on the substrate 8, as a mark for detecting the relative position in the Y direction. Furthermore, the moiré fringes for detecting the relative positions in the Y direction are generated by illuminating the two grating patterns 10b and 11b with the light beams from the second pole IL2 and the fourth pole IL4, which are aligned on the X-axis on the pupil plane PI of the illumination optical system 22.

An example in which the grating patterns 10a and 10b have the same grating pitch and the grating patterns 11a and 11b have the same grating pitch has been described above. However, the present invention is not limited to this. That is, the grating patterns 10a and 10b may also have different grating pitches, and the grating patterns 11a and 11b may also have different grating pitches. In addition, the distances from the optical axis of the detection optical system 21 to the centers of the first pole IL1 and the second pole IL2 may also be different, and the distances from the optical axis of the detection optical system 21 to the centers of the third pole IL3 and the fourth pole IL4 may also be different.

To detect one moiré fringe pattern, the detector 3 according to this embodiment illuminates, from an oblique direction, the marks 10 and 11 with light beams from two regions (poles) of the pupil plane PI of the illumination optical system 22, and detects, from the vertical direction, the moiré fringes formed by this illumination. Employing such an arrangement can ensure a light amount which is twice of that of a conventional detector that detects moiré fringes by illuminating the marks 10 and 11 from a single direction. As a result, the detector 3 can accurately detect the relative positions of two objects. The detector 3 according to this embodiment can detect diffracted light whose wavelength $\lambda$ is within a range that satisfies equation (7) as described above. However, it is preferable to set this wavelength range as broad as possible.

Also, each mark 11 provided on the substrate 8 is rarely exposed to the surface of the substrate 8, and is often positioned inside a stacked structure made of a plurality of layers (for example, several layers to several tens of layers). When a layer made of a transparent material is formed on the mark 11, the intensity of light from the mark 11 may greatly decrease, due to the occurrence of a so-called thin-film interference, depending on the wavelength of the illumination light. In such a case, the mark 11 can be made visible by changing the wavelength $\lambda$ of the illumination light so that the current illumination conditions will fall outside the conditions generating the thin-film interference. Hence, it is desirable to make the wavelength $\lambda$ of the illumination light variable within a broad range when observation is to be performed by the detector 3 as well, and set conditions that will allow each mark to be detected best in accordance with the process of forming the substrate 8. The conditions to be determined herein mentioned include, for example, the grating pitch of each mark, the numerical aperture NAo, the central positions of the first and second poles, the wavelength range and central wavelength of the illumination light, and the like. As the wavelength $\lambda$ of the illumination light, it is possible to extract a desired wavelength band by a bandpass filter or the like by using, as the light source 23, a light source which has a wideband wavelength such as a halogen lamp, or by arranging a plurality of monochromatic light sources such as LEDs which have different central wavelengths and switching between the plurality of monochromatic light sources.

Figure 11:
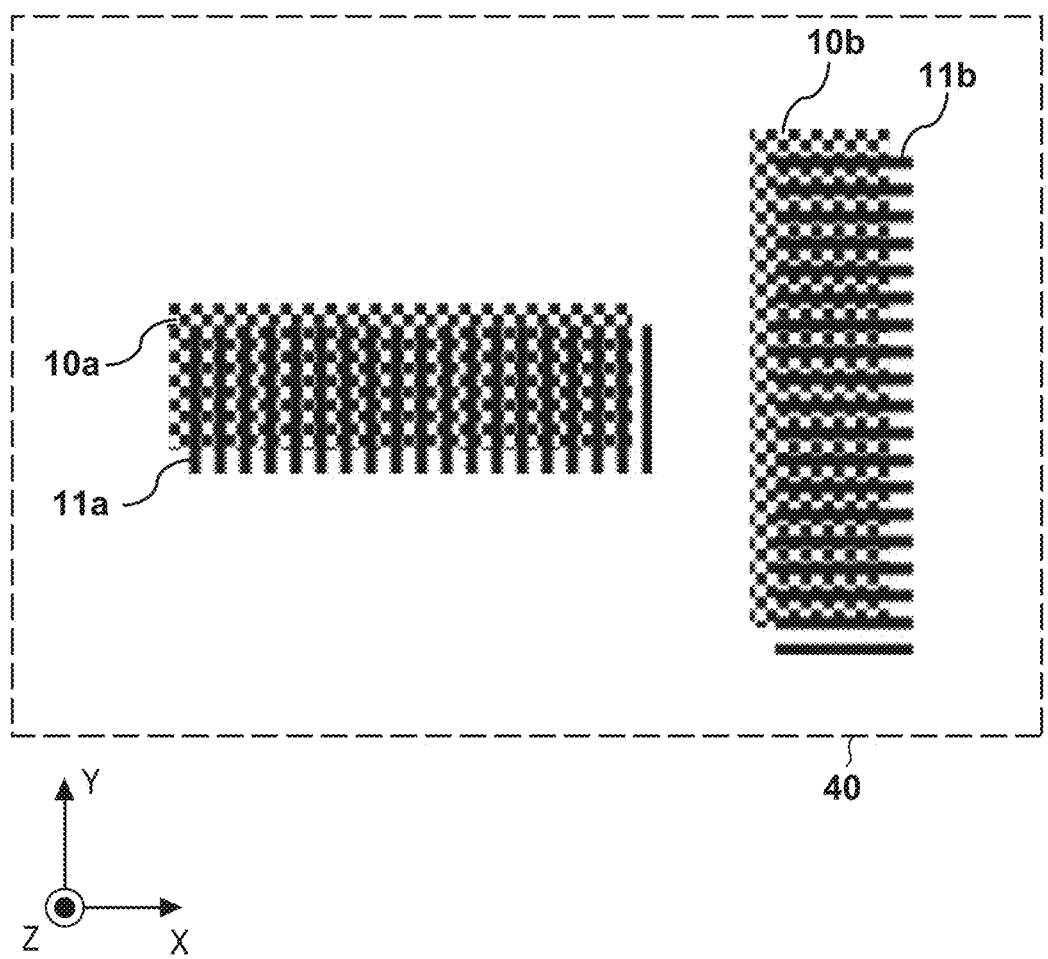
FIG. 11 is a view showing an example of the marks that form the pairs of marks.

As shown in FIG. 11, a pair of marks formed by the marks 10a and 11a and a pair of marks formed by the marks 10b and 11b can be simultaneously placed in the field of view of the detector 3, which includes the illumination aperture stop 27 on the pupil plane PI of the illumination optical system 22 and the detection aperture stop 26 on the pupil plane PD of the detection optical system 21 as shown in FIG. 1. As a result, one detector 3 can be used to simultaneously perform the relative position detection in the X direction using the pair of marks 10a and 11a and the relative position detection in the Y direction using the pair of marks 10b and 11b. That is, in this embodiment, one detector 3 (the detection optical system 21 and the illumination optical system 22) can simultaneously obtain the pieces of relative position information in the two X and Y directions by using a simple arrangement.

Figure 2A:
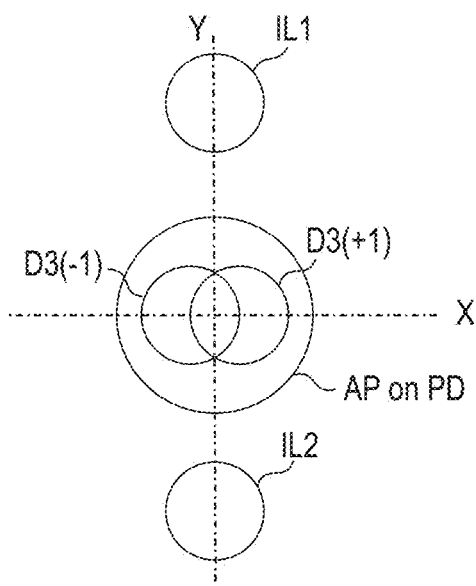
FIGS. 2A to 2D are views for explaining the effects of the embodiment.
Figure 2B:
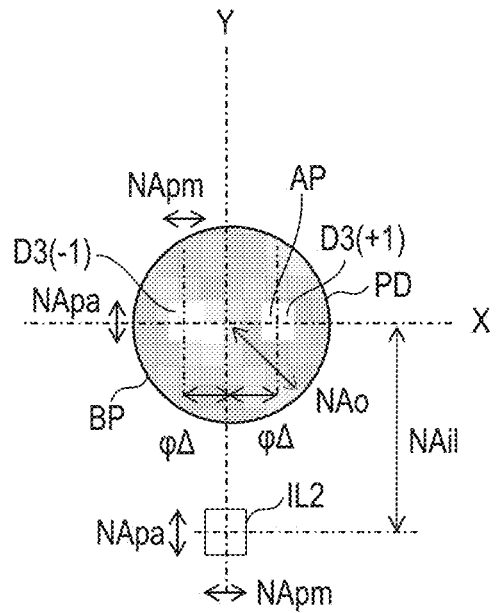

The effects of the embodiment will be described with reference to FIGS. 2A to 2D. FIG. 2A is a schematic view of a detector according to a comparative example in which the aperture of the illumination stop on the pupil plane PI of the illumination optical system 22 and the aperture of the detection stop on the pupil plane PD of the detection optical system 21 both have a circular shape. FIG. 2B is a schematic view of the detector 3 according to the present invention in which the aperture of the illumination aperture stop 27 on the pupil plane PI of the illumination optical system 22 has a rectangular shape and the aperture AP of the detection aperture stop 26 on the pupil plane PD of the detection optical system 21 has a rectangular shape. For the sake of descriptive convenience, only the aperture corresponding to the pole IL2 among the plurality of poles of the illumination aperture stop 27 is shown in FIG. 2B. Reference symbols D3(+1) and D3(-1) represent diffracted light beams illuminated by the light from the pole IL2 and diffracted by the mold 7 and the substrate 8. The diffracted light beams D3(+1) and D3(-1) pass through the corresponding apertures AP of the detection aperture stop 26 at the same size, as the second pole IL2, in the X direction=NApm and in the Y direction=NApa, and are detected by the image sensor 25.

FIG. 2B shows an example in which the light from the pole IL2 has a wavelength that passes the X-axis of the pupil plane PD of the detection optical system 21. In this case, the wavelength $\lambda$ is represented by equation (5) and satisfies NAil=Sin $\varphi$mn=$\lambda$/Pmn. The light beams necessary for detecting the relative positions of the marks 10 and 11 are only the light beams D3(-1) and D3(+1), and light other than these light beams is unnecessary light. Hence, the signal contrast can be improved by blocking the unnecessary light. In FIG. 2B and in FIGS. 2C and 2D (to be referred later), the detection aperture stop 26 arranged on the pupil plane PD of the detection optical system 21 has the apertures AP, and a portion other than the apertures AP can be formed by a blocking portion BP so as to block the unnecessary light.

Figure 12A:
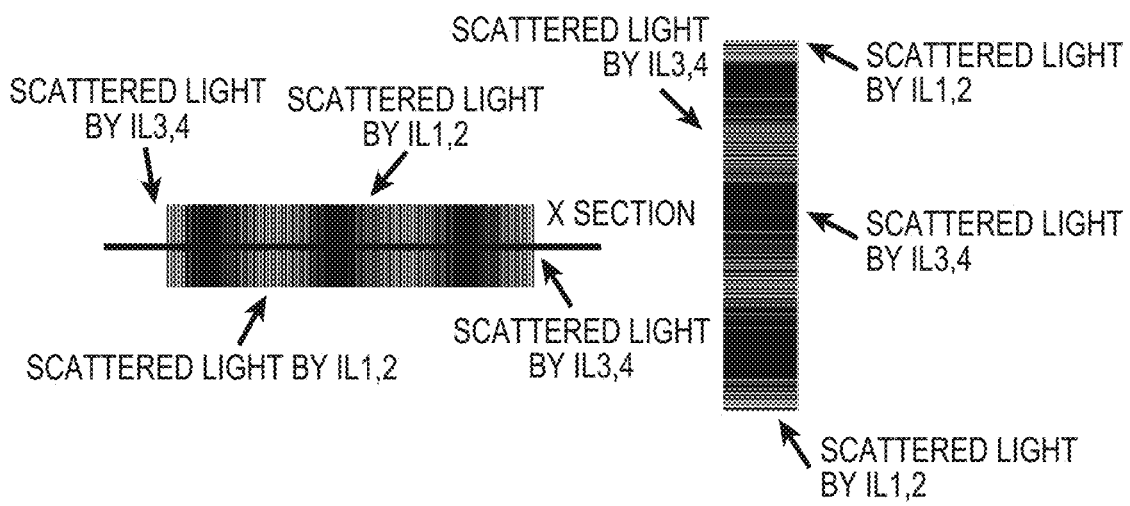
FIGS. 12A and 12B are views for explaining the influence of scattered light (unnecessary light)
Figure 12B:
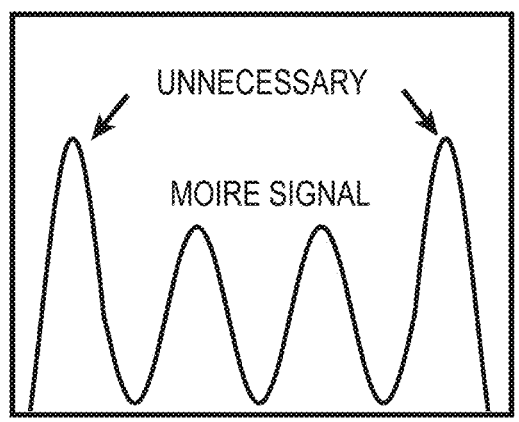

The unnecessary light will be described hereinafter. In the dark-field illumination method described in FIG. 1, when the relative positions in the X direction are detected as shown in FIG. 12A, the edges of a mark can cause the light beams from the poles IL3 and IL4, which do not contribute to the detection, to become scattered light beams (unnecessary light beams) that have distributions that scatter broadly on the X-axis. Since these scattered light beams will pass through the pupil plane PD, the scattered signal of each scattered light beam will mix with the moiré fringes. In addition, the edges of the mark can also cause the light beams from the poles IL1 and IL2 for detecting the relative positions in the X direction to become scattered light beams (unnecessary light beams). Since these scattered light beams will also pass through the pupil plane PD, the scattered signal of each scattered light beam will also mix with the moiré fringes. FIG. 12B shows a sectional view of the X direction of a moiré signal forming the moiré fringes. The scattered signals of the scattered light beams (unnecessary light beams) generated by the edges of the mark have mixed with the moiré signal in the X direction, thereby generating an adverse effect. Two of the four periods of the moiré signal have been influenced by the scattered light beams. This can cause the detection accuracy to degrade. In a similar manner, when the relative positions in the Y direction are detected, the edges of the mark can cause the light beams from the poles IL1 and IL2, which do not contribute to the detection in the Y direction, to become scattered light beams (unnecessary light beams). In addition, the edges of the mark can also cause the light beams from the poles IL3 and IL4 for detecting the relative positions in the Y direction to become scattered light beams (unnecessary light beams). The scattered signals from these scattered light beams can also mix with the moiré fringes.

As described above, in the detection of the relative positions in the X direction, the edges of a mark cause the light beams from the poles IL3 and IL4 to become scattered light beams (unnecessary light beams), and these scattered light beams will enter within the range of Y=±NApa/2 on the pupil plane PD. In addition, in the detection of the relative positions in the Y direction, the edges of the mark cause the light beams from the poles IL1 and IL2 to become scattered light beams (unnecessary light beams), and these scattered light beams will enter within the range of X=±NApa/2 on the pupil plane PD.

In addition, the edges of the mark can cause the light beam from each pole used to detect the relative positions to become scattered light beams (unnecessary light beams). In the detection of the relative positions in the X direction, the edges of the mark cause the light beams from the poles IL1 and IL2 to become scattered light beams (unnecessary light beams), and these scattered light beams will enter within the range of X=±NApa/2 on the pupil plane PD. In addition, in the detection of the relative positions in the Y direction, the edges of the mark cause the light beams from the poles IL3 and IL4 to become scattered light beams (unnecessary light beams), and these scattered light beams will enter within the range of Y=±NApa/2 on the pupil plane PD.

Figure 2C:
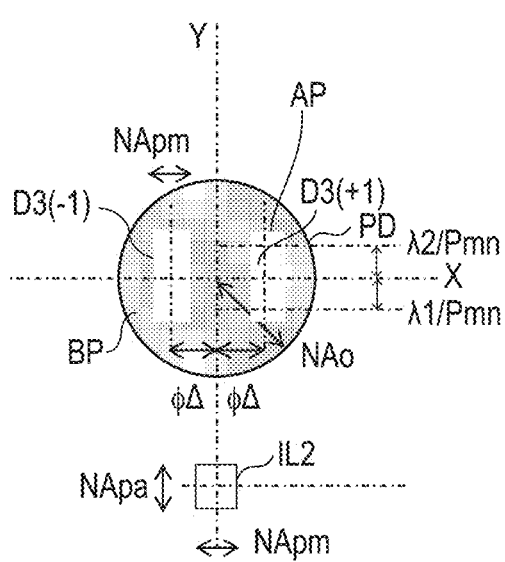

FIG. 2C shows an example in which the detection aperture stop 26 has been formed so as to allow all detection light beams (light beams other than the unnecessary light beams) having the wavelength width of λ1 to λ2 to pass through the corresponding apertures AP. Each aperture AP has a rectangular shape in which the X direction=NApm and the Y direction=NApa+(λ1−λ2)/Pmn. Since the angle of diffraction in the Y direction changes in accordance with the wavelength, each aperture AP is broadened in the Y direction by the amount of (λ1−λ2)/Pmn to allow the light beams of the wavelengths λ1 to λ2 pass through the aperture AP.

Figure 2D:
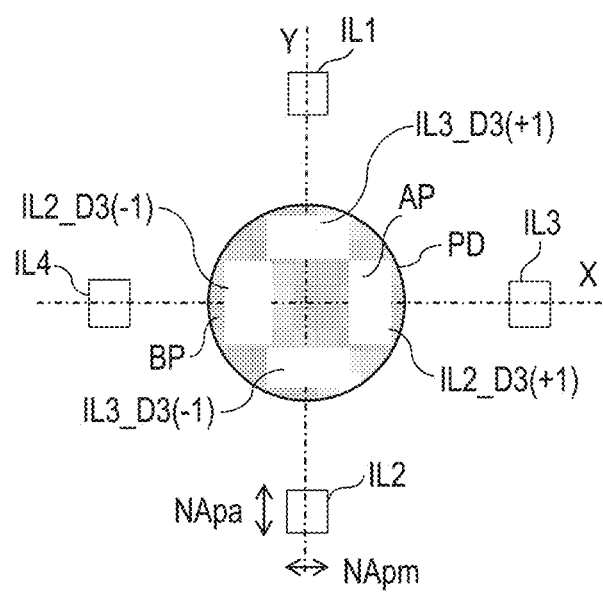

FIG. 2D shows the arrangement of the apertures AP of the detection aperture stop 26 arranged on the pupil plane PD of the detection optical system 21 and the arrangement of the poles IL1, IL2, IL3, and IL4 of the illumination aperture stop 27 arranged on the pupil plane PI of the illumination optical system 22. The arrangement shown in FIG. 2D can be used in the detection of the relative positions in both the X direction and the Y direction as shown in FIG. 11. The light from the pole IL2 passes through the apertures AP denoted by IL2_D3(−1) and IL2_D3(+1) and is detected by the image sensor 25. The light from the pole IL3 passes through the apertures AP denoted by IL3_D3(−1) and IL3_D3(+1) and is detected by the image sensor 25. Here, for the image sensor 25 to detect the light from the pole IL2, it is sufficient to arrange only the apertures AP denoted by IL2_D3(−1) and IL2_D3(+1). However, in order to simultaneously detect the relative positions in the Y direction, it is also necessary to arrange the apertures AP denoted by IL3_D3(−1) and IL3_D3(+1).

Since the blocking portion BP is included in the examples of arrangements shown in FIGS. 2B, 2C, and 2D, the area of the blocking portion BP in the range within Y=±NApa/2 and in the range within X=±NApa/2 has increased more than that in the example of the arrangement shown in FIG. 1. This means that a greater amount of unnecessary light can be blocked, and the detection accuracy of the relative positions can be improved effectively.

Several modifications of the above embodiment will be described hereinafter. In the first modification, the illumination aperture stop 27 shown in FIG. 6A and the detection aperture stop 26 shown in FIG. 6B are used. Polarization elements that cause the light beams emitted from the poles IL3 and IL4 to undergo Y polarization (polarization parallel to the Y-axis) and polarization elements that cause the light beams emitted from the poles IL1 and IL2 to undergo X polarization (polarization parallel to the X-axis) are provided in the illumination aperture stop 27 shown in FIG. 6A. X polarization and Y polarization are polarizations in different polarization directions from each other. Each polarization element can be, for example, a polarizing plate, a λ/4 plate, or an azimuth rotator. In the detection aperture stop 26 shown in FIG. 6B, polarization elements that transmit only Y-polarized light beams are arranged in regions where light beams IL3_D3(−1) and IL3_D3(+1) enter, and polarization elements that transmit only X-polarized light beams are arranged in regions where light beams IL2_D3(−1) and IL2_D3(+1) enter.

Since the light beams from the poles IL3 and IL4 are Y-polarized light beams, the diffracted light beams generated from these light beams are transmitted through the regions denoted by IL3_D3(−1) and IL3_D3(+1) on the pupil plane PD of the detection optical system 21. On the other hand, since the light beams from the poles IL1 and IL2 are X-polarized light beams, the diffracted light beams generated from these light beams are not transmitted through the regions denoted by IL3_D3(−1) and IL3_D3(+1) on the pupil plane PD of the detection optical system 21. In a similar manner, since the light beams from the poles IL1 and IL2 are X-polarized light beams, the diffracted light beams generated from these light beams are transmitted through the regions denoted by IL2_D3(−1) and IL2_D3(+1) on the pupil plane PD of the detection optical system 21. On the other hand, since the light beams from the poles IL3 and IL4 are Y-polarized light beams, the diffracted light beams generated from these light beams are not transmitted through the regions denoted by IL2_D3(−1) and IL2_D3(+1) on the pupil plane PD of the detection optical system 21. Hence, according to the first modification, the pupil plane PD of the detection optical system 21 can block the unnecessary light beams from the edges of the mark. As described above, by using polarization elements on the illumination aperture stop 27 and the detection aperture stop 26, it will be possible to simultaneously detect the moiré fringes in the X direction and the moiré fringes in the Y direction while blocking unnecessary light beams.

FIG. 13 shows a sectional view in the X direction of a moiré signal that forms the moiré fringes obtained in the first modification. By blocking the light beams (Y-polarized light beams) from the poles IL3 and IL4 at the pupil plane PD of the detection optical system 21, the image sensor 25 will be able to detect only the light beams (X-polarized light beams) from the poles IL1 and IL2.

Although the light beams emitted from the poles IL3 and IL4 are Y-polarized light beams and the light beams emitted from the poles IL1 and IL2 are X-polarized light beams in the first modification, it may be arranged so that the light beams emitted from the poles IL3 and IL4 will be X-polarized light beams and the light beams emitted from the poles IL1 and IL2 will be Y-polarized light beams. In such a case, polarization elements that allow only X-polarized light to be transmitted will be arranged in regions where the light beams IL3_D3(−1) and IL3_D3(+1) enter and, polarization elements that allow only Y-polarized light to be transmitted will be arranged in regions where the light beams IL2_D3(−1) and IL2_D3(+1) enter in the detection aperture stop 26.

Figure 6A:
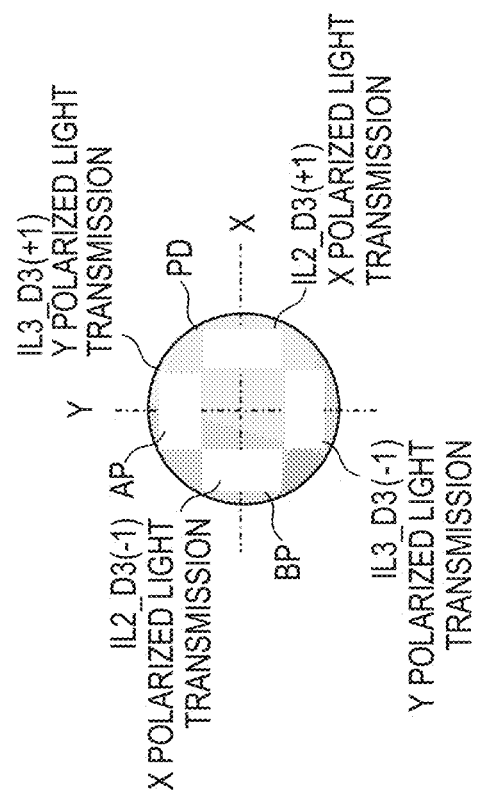
FIGS. 6A to 6E are views showing examples of the arrangements of a pupil plane of a detection optical system of the detector.
Figure 6B:
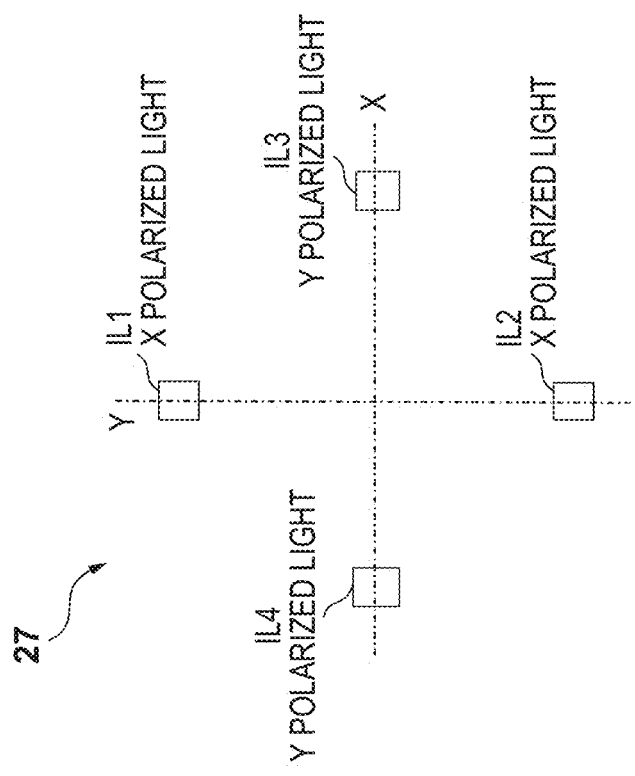
Figure 6C:
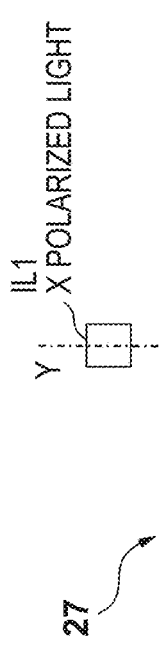
Figure 6E:
Figure 6E:
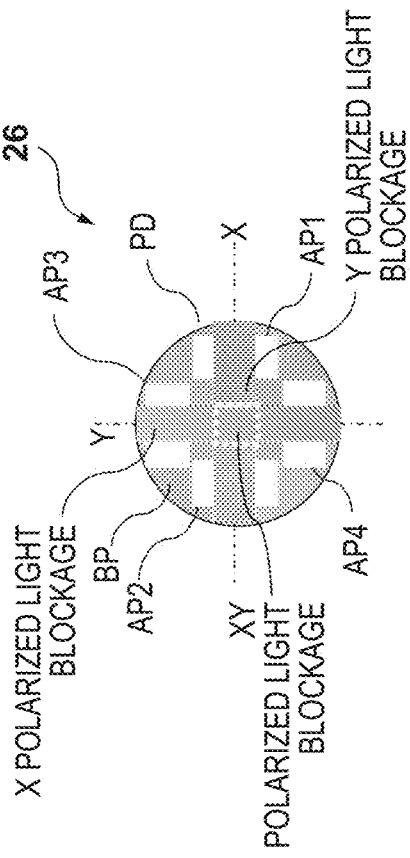

In the second modification, the illumination aperture stop 27 shown in FIG. 6A and the detection aperture stop 26 shown in FIG. 6C are used. The illumination aperture stop 27 shown in FIG. 6A is as described above. In the detection aperture stop 26 shown in FIG. 6C, a polarization element that blocks X-polarized light is arranged in the range of $Y=\pm NAo$ and $X=\pm NApm/2$, and a polarization element that blocks Y-polarized light is arranged in the range of $X=\pm NAo$ and $Y=\pm NApm/2$. Unnecessary light beams will be diffracted in the Y direction by illuminating an edge of a mark extending in the X direction or a line extending in the X direction with X-polarized light beams emitted from the poles IL1 and IL2. Although the unnecessary light beams generated when performing an illumination operation using the X-polarized light beams from the poles IL1 and IL2 can enter the range of $X=\pm NAo$ and $Y=\pm NApm/2$ on the pupil plane PD of the detection optical system 21, these unnecessary light beams can be blocked by arranging a polarization element for blocking X-polarized light in the detection aperture stop 26. In a similar manner, unnecessary light beams will be diffracted in the X direction by illuminating an edge of a mark extending in the Y direction or a line extending in the Y direction with Y-polarized light beams emitted from the poles IL3 and IL4. Although the unnecessary light beams generated when performing an illumination operation using the Y-polarized light beams from the poles IL3 and IL4 can enter the range of $Y=\pm NAo$ and $X=\pm NApm/2$, these unnecessary light beams can be blocked by arranging a polarization element for blocking Y-polarized light in the detection aperture stop 26. By blocking the unnecessary light beams at the pupil plane PD of the detection optical system 21, the image sensor 25 will be able to detect only the detection light.

Figure 6D:
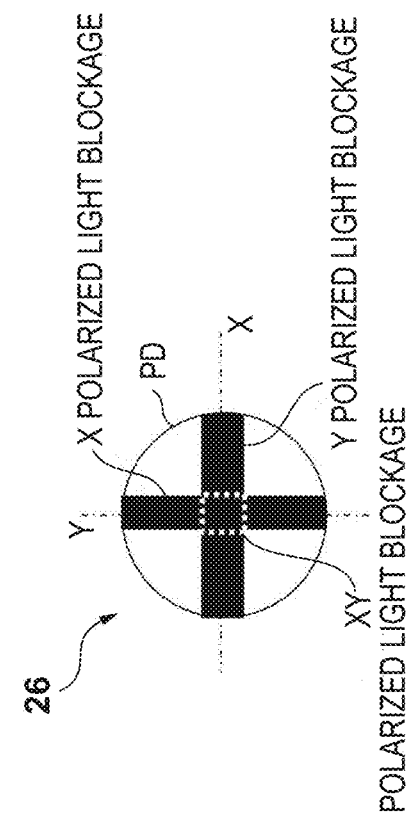

In the third modification, the illumination aperture stop 27 shown in FIG. 6A and the detection aperture stop 26 shown in FIG. 6D are used. The illumination aperture stop 27 shown in FIG. 6A is as described above. In the detection aperture stop 26 shown in FIG. 6D, a polarization element for blocking X-polarized light is arranged in the range of $Y=\pm NAo$ and $X=\pm NApm/2$ and a polarization element for blocking Y-polarized light is arranged in the range of $X=\pm NAo$ and $Y=\pm NApm/2$. Furthermore, the blocking portion BP and apertures AP1 to AP4 are provided on the pupil plane PD, and the X-polarized light beams from the poles IL1 and IL2 pass through the apertures AP1 and AP2. Also, at the apertures AP1 and AP2, the Y-polarized light beams from the poles IL3 and IL4 are blocked by corresponding Y-polarized light blocking portions (polarization elements that allow only X-polarized light to pass through).

Unnecessary light beams will be diffracted in the Y direction by illuminating an edge of a mark extending in the X direction or a line extending in the X direction with light beams emitted from the poles IL1 and IL2. The unnecessary light beams generated by the illumination operation of the X-polarized light beams from the poles IL1 and IL2 can enter the range of $X=\pm NAo$ and $Y=\pm NApm/2$ on the pupil plane PD of the detection optical system 21. However, the unnecessary light beams can be blocked arranging polarization elements that block X-polarized light in this region. In addition, the Y-polarized light beams from the poles IL3 and IL4 will not be able to pass through the respective Y-polarized light blocking portions of the apertures AP1 and AP2.

In a similar manner, the Y-polarized light beams from the poles IL3 and IL4 will pass through the apertures AP3 and AP4. Also, at the apertures AP3 and AP4, the X-polarized light beams from the poles IL1 and IL2 will be blocked by corresponding X-polarized light blocking portions (polarization elements that allow only Y-polarized light to pass through). Unnecessary light beams will be diffracted in the X direction by illuminating an edge of a mark extending in the Y direction or a line extending in the Y direction with light beams emitted from the poles IL3 and IL4. The unnecessary light beams generated by the illumination operation of the Y-polarized light beams from the poles IL3 and IL4 can enter the range of $X=\pm NApm/2$ and $Y=\pm NAo$. However, the unnecessary light beams can be blocked arranging polarization elements that block Y-polarized light in this region. In addition, the X-polarized light beams from the poles IL1 and IL2 will not be able to pass through the respective X-polarized light blocking portions of the apertures AP3 and AP4.

Although the light beams emitted from the poles IL3 and IL4 are Y-polarized light beams and the light beams emitted from the poles IL1 and IL2 are X-polarized light beams in the third modification, it may be arranged so that the light beams emitted from the poles IL3 and IL4 will be X-polarized light beams and the light beams emitted from the poles IL1 and IL2 will be Y-polarized light beams. In such a case, polarization elements for blocking Y-polarized light will be arranged on $X=0$, and polarization elements for blocking X-polarized light will be arranged on $Y=0$.

In the third modification, only the detection light is allowed to pass through and the unnecessary light beams are blocked at the pupil plane PD of the detection optical system 21. Although the relative positions in the X direction and the Y direction can be detected simultaneously in the third modification, the relative positions in the X direction and the Y direction may be detected separately.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 14A:
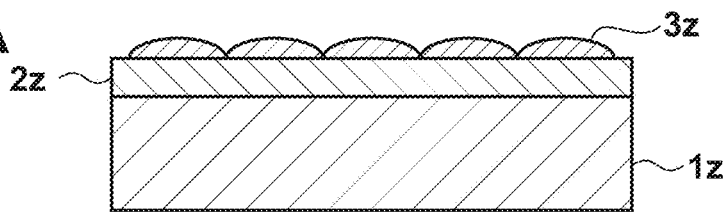
FIGS. 14A to 14F are views showing an example of a method of manufacturing an article.

An article manufacturing method in which an imprint apparatus forms a pattern on a substrate, processes the substrate on which the pattern is formed, and manufactures an article from the processed substrate will be described next. As shown FIG. 14A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 14B:
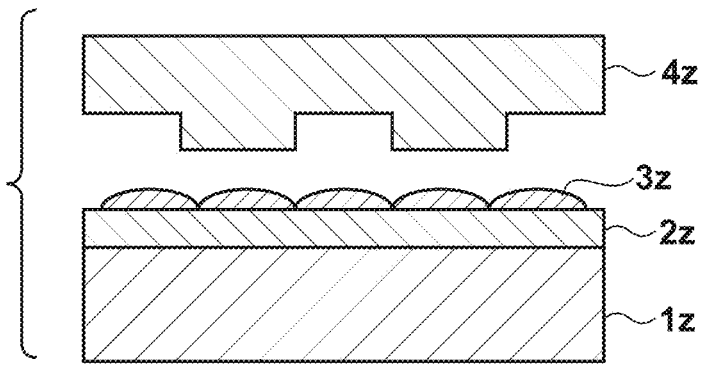
Figure 14C:
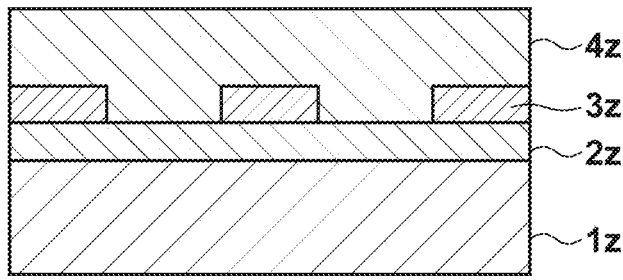

As shown in FIG. 14B, a side of a mold 4z for imprint with a concave-convex pattern is directed toward and made to face the imprint material 3z on the substrate. As shown FIG. 14C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 14D:
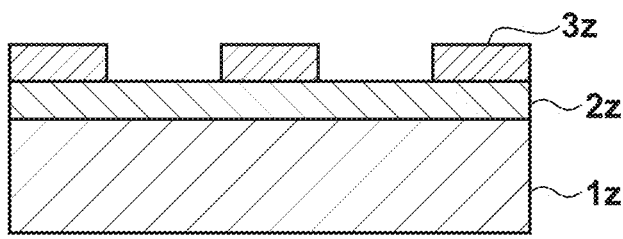

As shown in FIG. 14D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 14E:
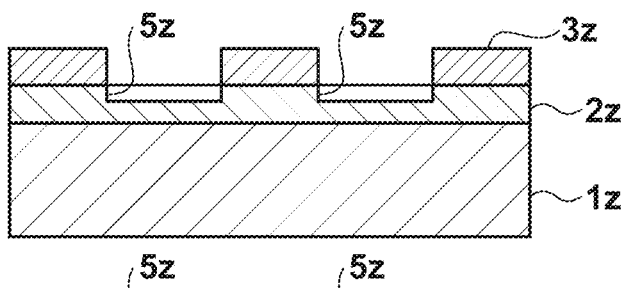
Figure 14F:
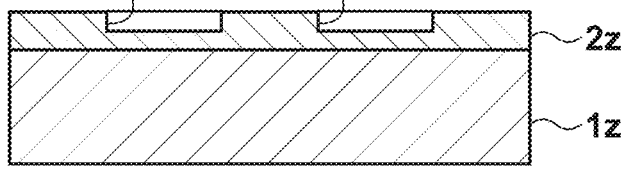

As shown in FIG. 14E, when etching is performed using the pattern of the cured product as an etching resistant mask, a portion of the surface of the processed material 2z where the cured product does not exist or remains thin is removed to form a groove 5z. As shown in FIG. 14F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-096338, filed Jun. 2, 2020, which is hereby incorporated by reference herein in its entirety.

What is claimed is:

1. A detector that detects relative positions of a first object and a second object in directions different from each other on a predetermined plane, comprising:
    an illumination optical system configured to illuminate a first mark provided on the first object and a second mark provided on the second object; and
    a detection optical system configured to detect interference light of diffracted lights from the first mark and the second mark illuminated by the illumination optical system,
    wherein the illumination optical system is configured to form a light intensity distribution, on a pupil plane of the illumination optical system, including an illumination light to obliquely illuminate the first mark and the second mark, and
    wherein the detection optical system includes a plurality of apertures, through which the interference light passes, and which are arranged on regions apart from a center of the pupil plane of the detection optical system, and the detection optical system further includes a light blocking portion including regions around the plurality of apertures and a region including and surrounding the center of the pupil plane of the detection optical system.

2. The detector according to claim 1, wherein the illumination optical system is configured to form the light intensity distribution, on the pupil plane of the illumination optical system, including the illumination light of at least one pole.

3. The detector according to claim 1, wherein the illumination optical system is configured to form the light intensity distribution, on the pupil plane of the illumination optical system, including at least two poles arranged to sandwich an optical axis.

4. The detector according to claim 1, wherein the illumination optical system is configured to form the light intensity distribution, on the pupil plane of the illumination optical system, including two poles which are arranged to sandwich an optical axis and to form a first pair and two poles which are arranged to sandwich the optical axis and to form a second pair.

5. The detector according to claim 4, wherein the two poles forming the second pair are arranged along a first direction, and the two poles forming the first pair are arranged along a second direction perpendicular to the first direction.

6. The detector according to claim 4, wherein first polarized light is emitted from each of the two poles forming the first pair, and second polarized light with a different polarization direction from the first polarized light is emitted from each of the two poles forming the second pair.

7. The detector according to claim 6, wherein the pupil plane of the detection optical system includes a region where a first polarization element configured to allow interference light generated by the first polarized light to pass through is arranged, and a region where a second polarization element configured to allow interference light generated by the second polarized light to pass through is arranged.

8. The detector according to claim 1, wherein an aperture stop is arranged on the pupil plane of the detection optical system.

9. A detector that detects relative positions of a first object and a second object on a first plane which is defined by a first direction and a second direction intersecting each other, the detector comprising:
    an illumination optical system configured to illuminate a first pair of marks, formed by a first mark provided on the first object and a second mark provided on the second object, and a second pair of marks, formed by a third mark provided on the first object and a fourth mark provided on the second object; and
    a detection optical system configured to detect first interference light from the first pair of marks illuminated by the illumination optical system and second interference light from the second pair of marks illuminated by the illumination optical system,
    wherein the illumination optical system is configured to form a light intensity distribution, on a pupil plane of the illumination optical system, including an illumination light to obliquely illuminate the first pair of marks and an illumination light to illuminate the first pair of marks from a direction parallel to a second plane defined by the normal of the first plane and the second direction, and including an illumination light to obliquely illuminate the second pair of marks and an illumination light to illuminate the second pair of marks from a direction parallel to a third plane defined by the normal and the first direction, and wherein of the detection optical system includes a plurality of apertures, through which the first interference light and the second interference light passes, and which are arranged on regions apart from a center of the pupil plane of the detection optical system, and the detection optical system further includes a light blocking portion including regions around the plurality of apertures and a region including and surrounding the center of the pupil plane of the detection optical system.

10. The detector according to claim 9, wherein the illumination optical system is configured to form the light intensity distribution, on the pupil plane of the illumination optical system, including two poles which form a first pair of poles arranged to sandwich an optical axis and two poles which form a second pair of poles arranged to sandwich the optical axis.

11. The detector according to claim 10, wherein the two poles forming the second pair of poles are arranged along the first direction, and the two poles forming the first pair of poles are arranged along the second direction.

12. The detector according to claim 10, wherein first polarized light is emitted from each of the two poles forming the first pair of poles, and second polarized light with a different polarization direction from the first polarized light is emitted from each of the two poles forming the second pair of poles.

13. The detector according to claim 12, wherein the pupil plane of the detection optical system includes a region where a first polarization element configured to allow interference light generated by the first polarized light to pass through is arranged, and a region where second polarization element configured to allow interference light generated by the second polarized light to pass through is arranged.

14. An imprint apparatus that brings an imprint material on a shot region of a substrate and a pattern region of a mold into contact with each other, cures the imprint material, and forms a pattern made of a cured product of the imprint material, the apparatus comprising:
a detector defined in claim 1 and arranged so as to detect relative positions of the shot region and the pattern region,
wherein the shot region and the pattern region are aligned based on the relative positions detected by the detector.

15. A method of manufacturing an article, comprising:
forming a pattern on a substrate by using an imprint apparatus defined in claim 14; and
processing a substrate on which the pattern has been formed in the forming,
wherein an article is obtained from the substrate that has undergone the processing.

* * * * *